United States Patent [19]

Hill

[11] Patent Number: 5,544,107

[45] Date of Patent: Aug. 6, 1996

[54] DIAGNOSTIC DATA PORT FOR A LSI OR VLSI INTEGRATED CIRCUIT

[75] Inventor: John P. Hill, Nederland, Colo.

[73] Assignee: Adaptec, Inc., Milpitas, Calif.

[21] Appl. No.: 294,127

[22] Filed: Aug. 22, 1994

[51] Int. Cl.⁶ .......................... H03K 19/177; G06F 11/26
[52] U.S. Cl. ......................... 365/201; 371/21.1; 371/22.1
[58] Field of Search .................................. 365/200, 201; 371/10.1, 10.2, 15.1, 21.1, 22.1

[56] References Cited

U.S. PATENT DOCUMENTS

| | | | |
|---|---|---|---|
| 4,424,543 | 1/1984 | Lewis et al. | |
| 4,530,019 | 7/1985 | Penniman | |
| 4,669,004 | 5/1984 | Moon et al. | |
| 4,761,768 | 8/1988 | Turner et al. | 365/201 |
| 4,823,212 | 4/1989 | Knowles et al. | |
| 4,827,476 | 5/1989 | Garcia | 371/25 |
| 4,918,378 | 4/1990 | Katircioglu et al. | 365/201 |
| 4,942,576 | 7/1990 | Busack et al. | 365/201 |
| 5,233,564 | 8/1993 | Ohshima et al. | 365/201 |
| 5,256,963 | 10/1993 | Johnson | 324/158 R |

Primary Examiner—Viet Q. Nguyen

Attorney, Agent, or Firm—Skjerven, Morrill, MacPherson, Franklin & Friel; Forrest E. Gunnison

[57] ABSTRACT

A two-wire dedicated diagnostic data port in an integrated circuit provides visibility for all internal functions of the integrated circuit. An internal signal or signals are written to a serially connected memory in the dedicated diagnostic data port. The serially connected memory is connected to a two-wire output port of the dedicated diagnostic data port. A first wire in the two-wire output port is a data wire and a second wire in said the wire output port is a clock wire. Transfer of the stored information from the serially connected memory to the two-wire output port is initiated by writing to a control register in the dedicated diagnostic data port. In response to writing to the control register, a clock signal on a clock input line to the dedicated diagnostic data port is coupled to the second wire, and is used to serially shift the stored information from the serially connected memory to the data wire. The signals on the two-wires from the integrated circuit are processed by a shift/latch control circuit that is external to the integrated circuit. A predetermined time after the clock signal on the clock wire terminates, i.e., remains inactive for a predetermined period, the shift/latch control circuit generates a latch signal that can be used to capture the data transmitted over the data wire.

15 Claims, 5 Drawing Sheets

DIAGNOSTIC DATA PORT FOR A LSI OR VLSI INTEGRATED CIRCUIT

BACKGROUND OF THE INVENTION

Reference to Appendix

Appendix A is a part of the present disclosure, and is incorporated herein by reference in its entirety.

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

Field of the Invention

The present invention is related generally to monitoring operation of an integrated circuit and in particular to an integrated circuit output port for transporting information concerning any user selected operation of the integrated circuit from the integrated circuit.

Description of Related Art

As the form factor of hard disk drives become smaller and as the level integration for all disk drives becomes greater, the number of functions performed by a single integrated circuit in a disk drive increases substantially. As the number of functions performed by an integrated circuit increases, i.e., as the integration level increases, many of the functions are performed completely internally to the integrated circuit.

For functions that are performed completely internally, neither input, output, nor intermediate signals are available at pins of the integrated circuit. Further, the integrated circuit package size limits the number of available pins. The limited number of pins makes it unfeasible to route representative signals for each of the internal functions to a pin. Consequently, monitoring and testing of highly integrated circuits becomes problematic.

In the area of disk drive controllers, integration is becoming increasingly greater. Disk drive controller circuits that previously occupied a plug-in board are now packaged in a single integrated circuit. The plug-in boards had space for test points, switches for generating test signals, and other commonly known features that permitted relatively easy verification of the operation of the disk controller. When the same functionality is provided in an integrated circuit, there is no space for test points, switches and similar circuitry.

Therefore, typically, computer simulations are used to verify the operation of circuitry that is totally internal to an integrated circuit. Unfortunately, such simulations do not provide reliable information on the actual application performance of the integrated circuit. To obtain reliable application performance data, a way is needed to obtain information concerning all of the circuits within the integrated circuit while the circuits are in operation.

SUMMARY OF THE INVENTION

In accordance with the principles of this invention, a two-wire dedicated diagnostic data port is included in an integrated circuit such as a mixed signal CMOS large scale integrated circuit. In another embodiment, the two-wire dedicated diagnostic data port is included in a very large scale integrated circuit. The dedicated diagnostic data port provides visibility for all internal functions of an integrated circuit. Herein, an internal function, e.g., an internal signal, is a signal that is not provided directly to a pin of the integrated circuit, or is not observable through an intermediate signal that is provided to a pin of the integrated circuit. Therefore, the need to provide additional circuitry onboard the integrated circuit for each internal signal or function that must be monitored has been eliminated.

Specifically, the dedicated diagnostic data port of this invention is a programmable data port that can be used in development and testing processes related to operation of the integrated circuit as well as monitoring normal functioning of the integrated circuit. The dedicated diagnostic data port is available at all times and does not inhibit any functions of the integrated circuit during its operation.

An internal signal or signals are written to a serially connected memory in the dedicated diagnostic data port. The serially connected memory is connected to a two-wire output port of the dedicated diagnostic data port which in this embodiment is two pins of the integrated circuit. A first wire in the two-wire output port is a data wire and a second wire in the two-wire output port is a clock wire.

Transfer of the stored information from the serially connected memory to the two-wire output port is initiated by writing to a control register in the dedicated diagnostic data port. In response to writing to the control register, a clock signal on a clock input line to the dedicated diagnostic data port is coupled to the second wire, and is used to serially shift the stored information from the serially connected memory to the data wire. In one embodiment, the serially connected memory is a plurality of serially connected registers that are connected to a processor data bus and coupled to a processor address bus so that the processor can load data, i.e., internal signals, into the serially connected memory.

The signals on the two-wires from the integrated circuit are processed by a shift/latch control circuit that is external to the integrated circuit. A predetermined time after the clock signal on the clock wire terminates, i.e., remains inactive for a predetermined period, the shift/latch control circuit generates a latch signal that can be used to capture the data transmitted over the data wire.

The shift/latch control circuit eliminates the need for a three wire synchronous interface. Specifically, according to the principles of this invention, a latch signal is generated by detecting that the clock sequence has stopped after the clock sequence was started. Typically, in a three wire synchronous interface, the third wire carries a shift enable versus a latch signal. However, with the shift/latch control circuit, only the two-wires are required. This is a significant improvement, because it reduces the number of pins of an integrated circuit that are needed to support the dedicated diagnostic data port of this invention. As is known to those skilled in the art, as the integration on a chip increases, one of the limiting factors is the number of pins on the integrated circuit.

In one embodiment, the shift/latch control circuit includes an oscillator circuit that generates a second clock signal having a second frequency that is less than the clock frequency, i.e., the first clock frequency, on the clock wire of the dedicated diagnostic data port. A first storage element in the shift/latch control circuit has a clock terminal that is coupled to the oscillator circuit; an input terminal that is connected to an active signal source; and a clear terminal that is coupled to the clock wire of the dedicated diagnostic data port. Thus, when the first clock signal is active, the first storage element is normally cleared before the second clock signal can load the active signal into the first storage element. However, the timing of the first and second clock signals may be such that the active signal is loaded in the first storage element and applied to an input terminal of a second storage element.

The second storage element in the shift/latch control circuit also has a clock terminal that is coupled to the oscillator circuit, and a clear terminal that is coupled to the clock wire of the dedicated diagnostic data port. Thus, the first and second storage elements are cleared by the first clock signal on the dedicated diagnostic data port clock wire before the active signal in the first storage element can be loaded into the second storage element by the second clock signal from the oscillator circuit.

However, when the first clock signal remains inactive, i.e., in a predetermined state, for a predetermined time period, the active signal is clocked by the second clock signal through the first and second storage elements to an output terminal of the second storage element.

The output terminal of the second storage element is connected to a clock terminal of a third storage element in the shift/latch control circuit. An input terminal of the third storage element is connected to an active signal source and so the rising edge on the clock terminal from the second storage element drives the signal on its output terminal active which in turn is a latch signal that has been generated a predetermined time interval after termination of the first clock signal on the clock wire.

DETAILED DESCRIPTION

Figure 1:
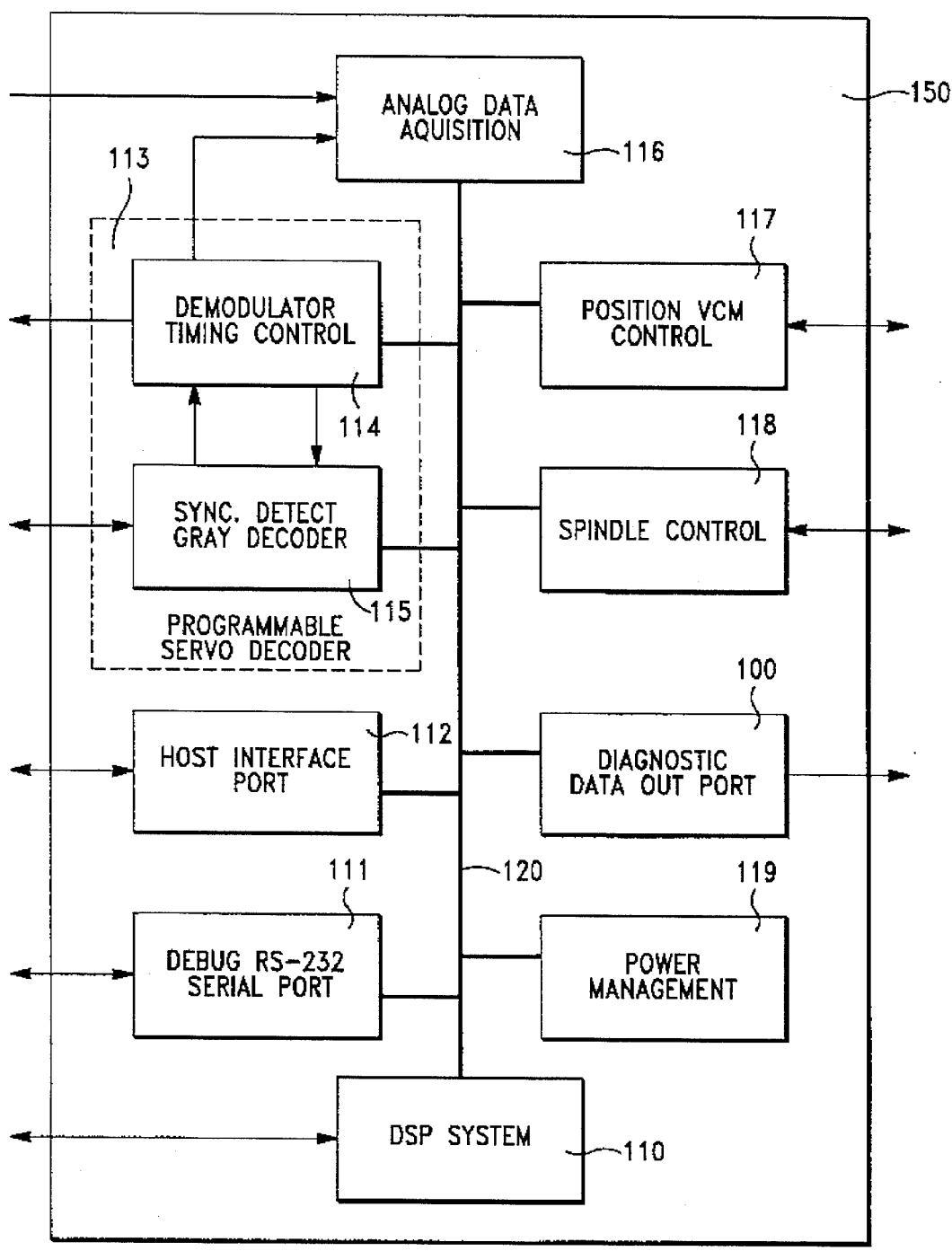
FIG. 1 is a block diagram of an integrated circuit containing the diagnostic data port of this invention.

In accordance with the principles of this invention, a dedicated diagnostic data port 100 is included in a mixed signal CMOS large scale integrated motion control integrated circuit 150 for a disk drive. Dedicated diagnostic data port 100 provides visibility for all internal functions of integrated circuit 150. Specifically, dedicated diagnostic data port 100 of this invention is a programmable data port that can be used in development and testing processes. Dedicated diagnostic data port 100 is available at all times and does not inhibit any functions of integrated circuit 150 during its operation.

In one embodiment, diagnostic data port 100 of this invention is included in an integrated circuit 150 that includes in addition to diagnostic data port 100: a digital signal processor (DSP) system 110 that includes a DSP core, random access memory (RAM), read-only memory (ROM), timers, and an interrupt controller; a RS-232 serial port 111; a host interface port 112; a programmable servo burst decoder circuit 113 that includes a synchronization detector and gray code decoder 115 and a demodulator and timing control circuit 114; an analog data acquisition circuit 116; a position VCM control circuit 117; a spindle control circuit 118; and a power management circuit 119. The particular configuration of the circuits included within integrated circuit 150 that contains diagnostic data port 100 are not critical to this invention. Herein, DSP system 110 is sometimes referred to as DSP 110.

One embodiment of programmable servo burst decoder 113 suitable for use in this invention is described in copending, commonly filed, and commonly assigned, U.S. patent application Ser. No. 08/293,981 entitled "A Programmable Servo Burst Decoder" of Nicolas C. Assouad et al. filed on Aug. 22, 1994, which is incorporated herein by reference in its entirety. Programmable servo burst decoder 113 includes a programmable timing mark sequencer and a programmable burst sequencer as described more completely in U.S. patent application Ser. No. 08/293,981, entitled "A Programmable Servo Burst Decoder." One embodiment of an analog data acquisition system 116 suitable for use in this invention is described in copending, commonly filed, and commonly assigned, U.S. patent application Ser. No. 08/293,973 entitled "Analog Data Acquisition System For Servo Position Bursts," of John P. Hill, filed on Aug. 22, 1994 which is incorporated herein by reference in its entirety.

In this embodiment, diagnostic data port 100 sits on an address and data bus 120 of DSP 110. Consequently, any data available to DSP 110 can be supplied to diagnostic data port 100. Therefore, a wide variety of internal data of integrated circuit 150 can be sent off chip by DSP 110 writing the internal data to diagnostic data port 100.

Figure 2:
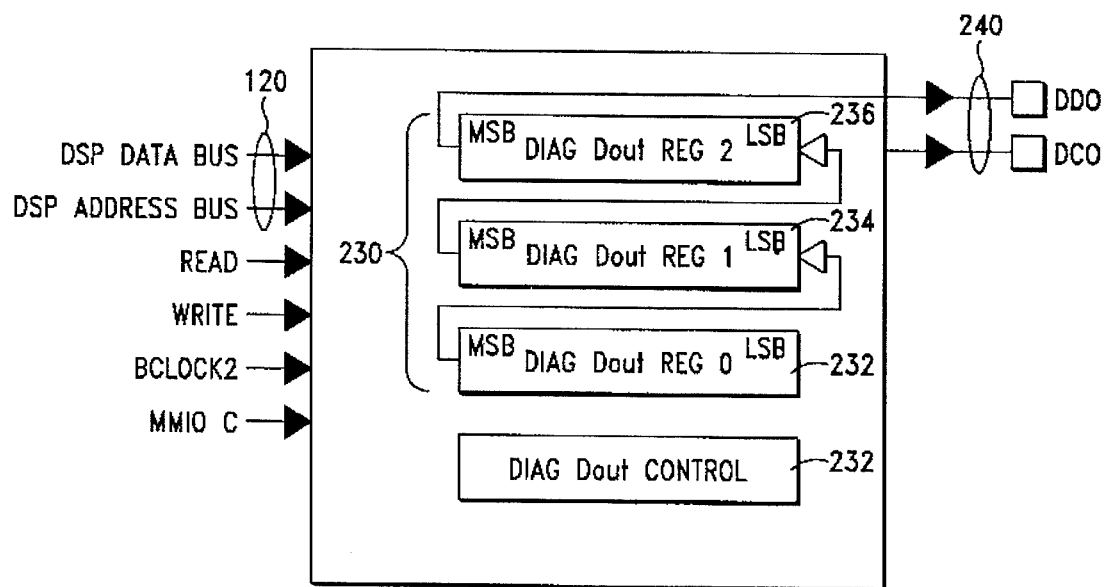
FIG. 2 is a block diagram of the diagnostic data port of this invention.

A more detailed block diagram of diagnostic data port 100 is presented in FIG. 2. In this embodiment, diagnostic data port 100 includes a serially connected memory 230, a control register 231, and a two-wire unidirectional serial interface 240. Serially connected memory 230, in this embodiment, includes three serially linked 16-bit registers 232, 234 and 236, that are individually both readable and writable by DSP 110 using DSP data bus and DSP address bus 120. The serial output terminal of register 236 is connected to diagnostic data out pin DDO of integrated circuit 150, that is a first output terminal of diagnostic data port 100.

A second output terminal of diagnostic data port 100 is diagnostic clock out pin DCO. The clock signal on diagnostic clock out pin DCO is a diagnostic clock signal driven by the clock signal on line BCLOCK2 that serially shifts data through register 232 to register 234 and then to register 236.

Input lines READ, WRITE, and MMIO CS to diagnostic data port 100 are driven by a DSP memory controller within integrated circuit 150. Input line READ carries a read strobe signal while input line WRITE carries a write strobe signal. The signal on line MMIO CS is the memory mapped I/O chip select signal. The signals on these lines along with the address on the DSP address bus determine the register that is accessed with diagnostic data port 100 and whether the access is a read or a write.

Firmware internal to DSP 110 controls the information written to registers 232, 234 and 236. An example of firmware to assist in testing and optimizing a digital control tracking system is given in Appendix A and is described more completely below.

To utilize diagnostic data port 100, the firmware instructs DSP 110 to write the desired information to registers 232, 234, and 236. To start the serial transfer of the information to output pin DDO, DSP 110 writes to control register 231. The information is serially shifted out of registers 236, 234, and 232 to pin DDO on each falling edge of the diagnostic clock starting with the most significant bit (MSB) of register 236 and ending with the least significant bit (LSB) of register 232.

In this embodiment, the frequency of the diagnostic clock on line BCLOCK2 and on pin DCO is one-fourth the frequency of the system clock for integrated circuit 150 and one-half the frequency of the bus clock for DSP 110. With a 40 MHz system clock, this configuration gives a serial bit rate of 10 MHz for diagnostic data port 100 which is a reasonable rate for wire transmission and a rate that can be decoded without requiring special techniques. Of course, diagnostic data port 100 could be clocked at the frequency of the bus clock if that was desirable.

Typically, the information is shifted out to a stand-alone diagnostic interface board containing a shift/latch control circuit as well as digital-to analog converters, logic analyzer connections, oscilloscope test points and so on. The rising edge of the clock signal on pin DCO is used to shift the data on line DDO into a shift register on the stand alone board.

Figure 3:
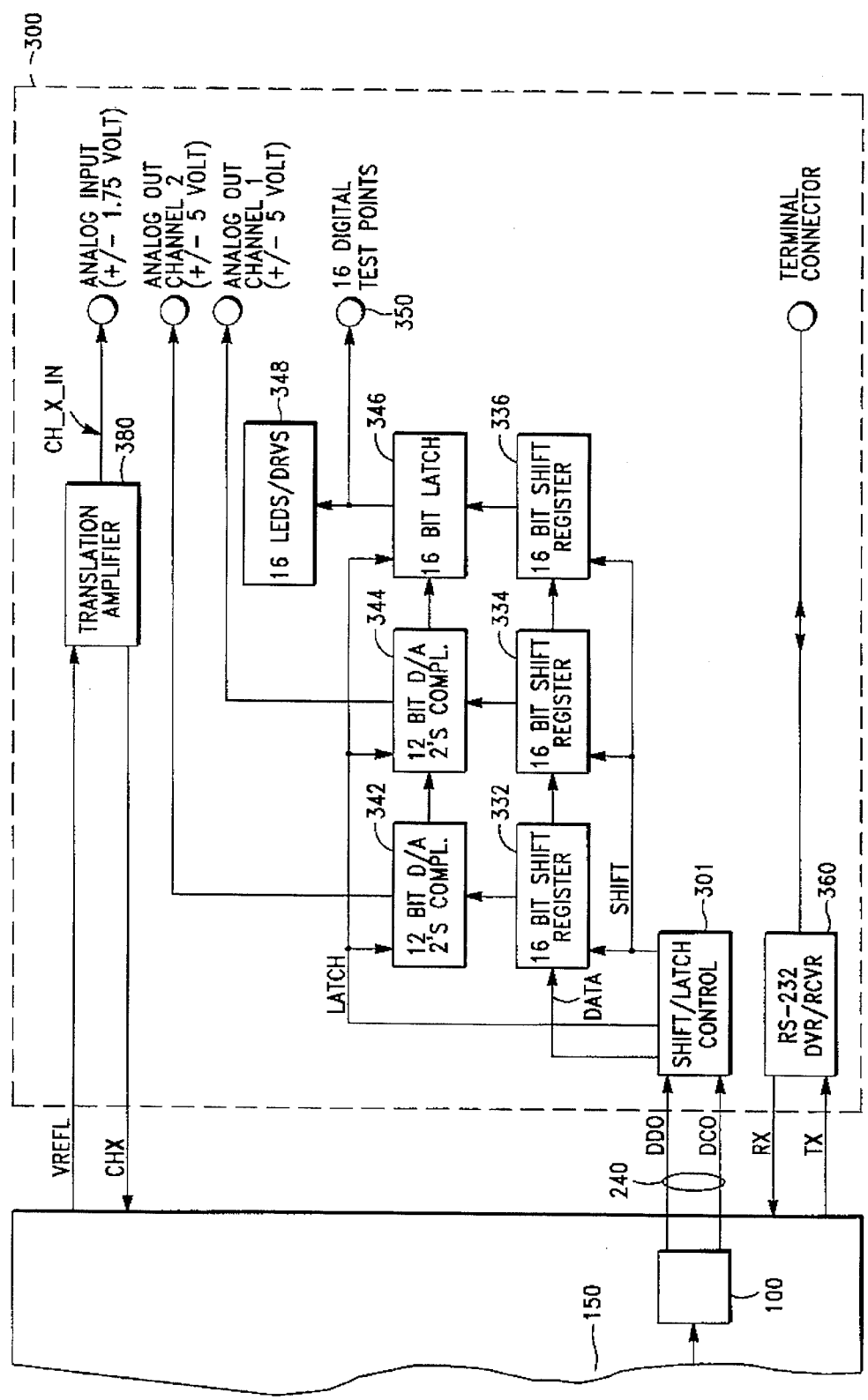
FIG. 3 is a block diagram of one embodiment of a diagnostic interface board of this invention.

FIG. 3 is a block diagram of one embodiment of a stand alone diagnostic interface board 300 suitable for use with diagnostic data port 100. Board 300 performs a serial to parallel conversion of the information from diagnostic data port 100 and generates one 16-bit digital channel and two 12-bit resolution analog channels. Hence, to use diagnostic interface board 300, the word written in register 236 by DSP 110 is digital data while the digital words written in registers 234 and 232 represent analog data.

Figure 4:
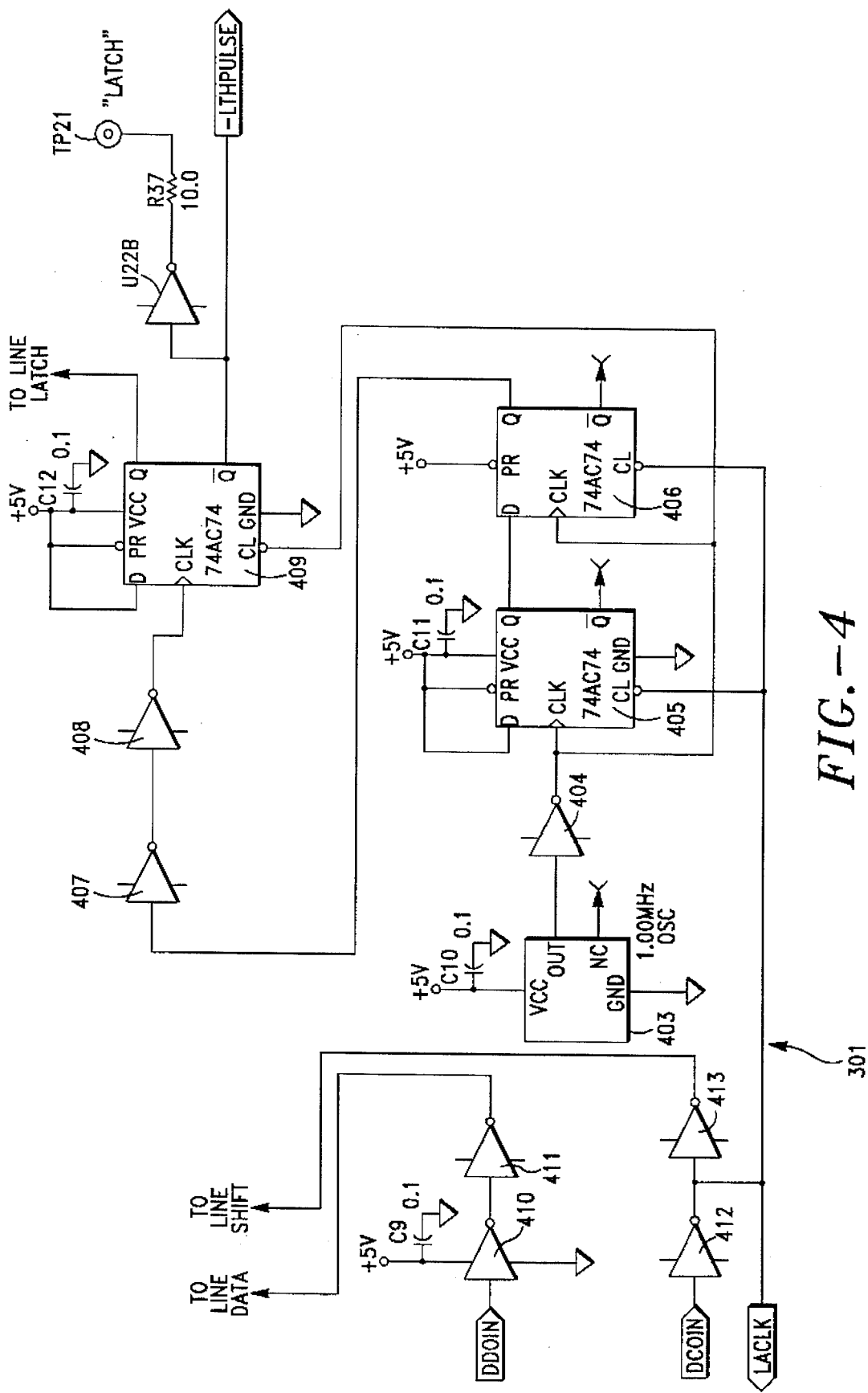
FIG. 4 is a schematic diagram of one embodiment of the shift/latch control circuit on the diagnostic interface board of this invention.

On board 300, the serial data from pin DDO and the clock signal from pin DCO are initially processed by shift/latch control logic 301. FIG. 4 is a more detailed schematic of one embodiment of shift/latch control logic 301. The information from pin DDO, i.e., the data, is buffered by shift/latch control circuit 301 and applied via line DATA to the serial input terminal of register 332.

The diagnostic clock signal is also buffered by shift/latch control circuit 301 and applied via line SHIFT to terminal CLK of registers 332, 334 and 336. The inverse of the diagnostic clock signal is applied to active low clear terminals CL of D-type flip-flops 405 and 406, which are used in generation of a latch pulse as described below.

Thus, the digital word from register 236 is serially shifted through registers 332 and 334 to register 336. Analog channels 1 and 2 are the second and third words shifted into register 334 and 332 respectively. In one embodiment, registers 332 to 336 are each a type 74AC164 register.

When the 48-bits have been shifted into registers 332 to 336, shift/latch control circuit 301 generates a latch pulse to store the three-sixteen bit words in a parallel format in D/A converter 342, D/A converter 344, and latch 346, respectively. For the circuit shown in FIG. 4, the latch pulse is generated when the clock signal from pin DCO remains low for a predetermined period, which in this embodiment is 1.0 µs±0.5 µs.

Specifically, in shift/latch control circuit 301, the data on input pin DDOIN is buffered by inverters 410 and 411 and supplied over line DATA to shift register 332. Similarly, the clock signal on input pin DCOIN is buffered by inverters 412 and 413 and the signal from inverter 413 drives line SHIFT to registers 332, 334, and 336. The output signal of inverter 412 is applied to the active low clear terminals CL of D-type flip-flops 405 and 406. Thus, when there is a clock signal on pin DCOIN, flip-flops 405 and 406 are cleared every clock cycle.

An inverted pulse from inverter 404, that is generated by the signal from 1.00 MHz oscillator 403, is applied to terminals CLK of D-type flip-flops 405 and 406. A logic one signal is applied to input terminal D of flip-flop 405 and output terminal Q of flip-flop 405 is connected to input terminal D of flip-flop 406. Hence, on a first rising edge from inverter 404, a logic one is loaded into flip-flop 405 and on the next rising edge from inverter 404, the logic one would be clocked into flip-flop 406. However, the frequency of oscillator 403 is less than the clock frequency on pin DCOIN. Thus, both flip-flops 405 and 406 are cleared so that the logic one is not loaded into flip-flop 406 so long as there is a clock signal on pin DCOIN.

When the clock signal on pin DCOIN stops, the logic one in flip-flop 405 is loaded into flip-flop 406. The resulting rising edge from output terminal Q of flip-flop 406 is buffered by inverters 407 and 408. The output signal of buffer 408 clocks a logic one into D-type flip-flop 409 that in turn generates a latch pulse on output terminal Q because an active low clear terminal of flip-flop 409 is connected to the output terminal of inverter 404. The latch pulse is available at test point TP21.

Shift/latch control circuit 301 is an important aspect of this invention because shift/latch control circuit 301 eliminates the need for a three wire synchronous interface. Specifically, as described above, a latch signal on diagnostic interface board 300 is generated by detecting that the input clock sequence has stopped after the input clock sequence was started. Typically, in a three wire synchronous interface, the third wire carries a shift enable versus a latch signal. However, with shift/latch control circuit 301, only two-wires are required for diagnostic data port 100. This is a significant improvement, because it reduces the number of pins of integrated circuit 150 that are needed to support port 100. As is known to those skilled in the art, as the integration on a chip increases, one of the limiting factors is the number of pins on the integrated circuit.

When the digital word is latched in latch 346, the 16-bits are displayed on bit oriented display by LED and LED drivers circuit 348. The digital word is also available on 16 digital test points 350 that may be used for triggering external test equipment or captured as data to display events or states internal to integrated circuit 150.

When the two digital words representing analog data are latched in digital-to-analog converters 342 and 344, two corresponding analog voltages are generated by the 12-bit D/A two's complement converters. In this embodiment, each 12-bit D/A converter 342, 344 is aligned with the 12 most significant bits of the latched digital word. The two's complement conversion scaling of D/A converters 342 and 344 is illustrated in Table 1.

TABLE 1

| D/A TWO'S COMPLEMENT CONVERSION SCALING | | | | |
|---|---|---|---|---|
| DATA WORD | | | | OUTPUT |
| MSB | | | LSB | VOLTAGE |
| 0111 | 1111 | 1111 | XXXX | +5.0 VOLTS |
| 0000 | 0000 | 0000 | XXXX | 0.0 VOLTS |
| 1000 | 0000 | 0000 | XXXX | −5.0 VOLTS |

The analog output voltages of D/A converters 342 and 344 are available on BNC analog out channel 1 and channel 2 connectors and on test points. These voltages can be analyzed by external test equipment to determine internal variable values or control loop characteristics within integrated circuit 150.

In this embodiment, diagnostic interface board 300 contains other hardware which may be used with this invention, but is not essential to the invention. The additional hardware is included only to demonstrate the usefulness of diagnostic data port 100 in monitoring internal functions of integrated circuit 150.

A digital shift register (SR) port connector and drivers are provided to support interfacing to a logic analyzer for other monitoring functions. The sixteen bits in shift register 332 are provided on digital SR port connector plus a clock that goes positive when the word is latched in D/A converter 342. Here, a positive edge is used because the positive edge marks the point in time where the data in shift register 332 is stable.

A RS-232 to/from logic level translator circuit 360 on diagnostic interface board 300 interfaces with output pins RX and TX of debug RS-232 serial port 111 of integrated circuit 150. Circuit 360 permits connection of a standard terminal or a computer in terminal mode to integrated circuit 150. In this embodiment, circuit 360 includes an integrated circuit Model No. AD232JR that is sold by Analog Devices of One Technology Way, P.O. Box 9106, Norwood, Mass. 02062-9106.

A system reset button and circuit on diagnostic interface board 300 generates an active low reset signal that can be applied to a reset pin of integrated circuit 150.

Figure 5:
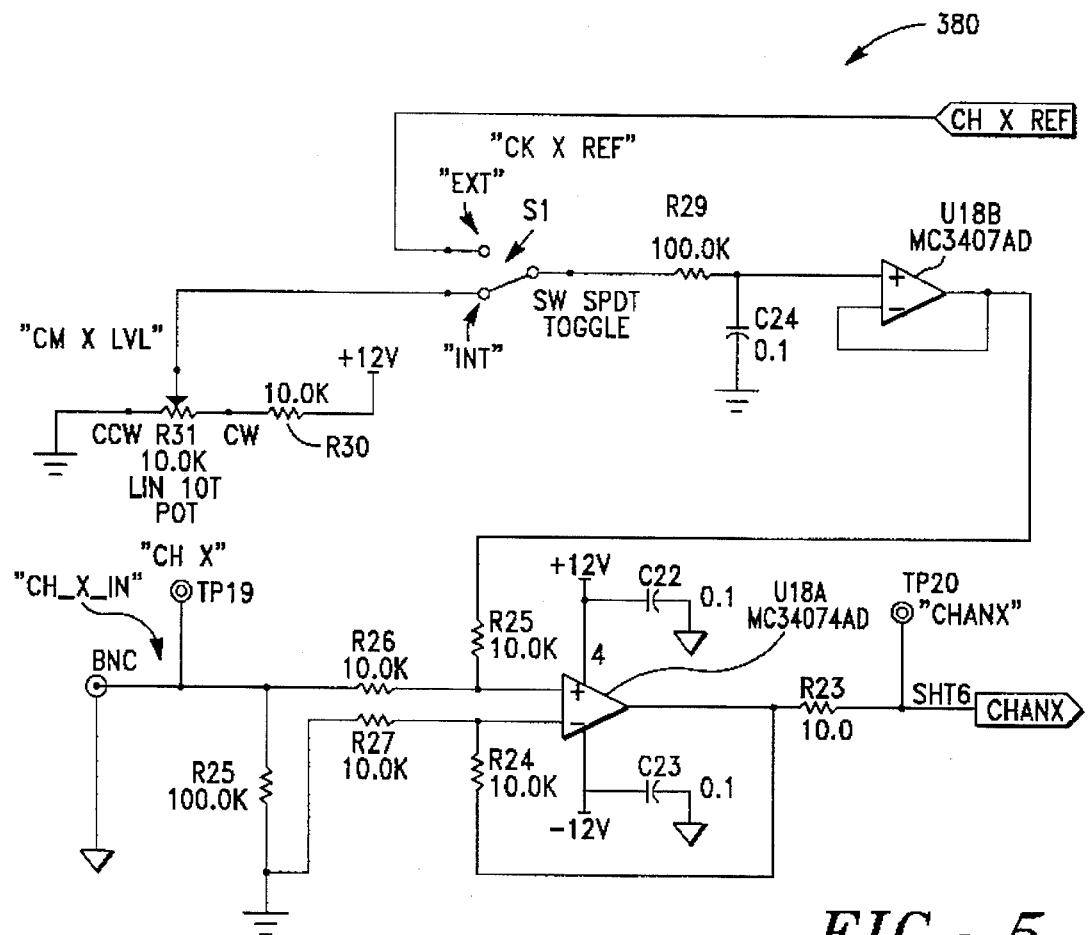
FIG. 5 is a schematic of one embodiment of the translation amplifier circuit on the diagnostic interface board of this invention.

FIG. 5 is a schematic diagram of an analog translation amplifier 380. Analog translation amplifier 380 is not required for diagnostic data port 100. Analog translation amplifier 380 is an example of a circuit that can be included on board 300 to test an integrated circuit. In this case, analog translation amplifier 380 is described in conjunction with features of analog data acquisition system 116. As explained more completely below, analog translation amplifier 380 generates signals that can be used by analog data acquisition system 116. DSP 110 could be programmed to write data from the analog data acquisition system 116 to diagnostic data port 100 and in this way operations of specific features of analog data acquisition system 116 could be observed.

In FIG. 5, line CH_X_REF is connected to output pin VREFL of integrated circuit 150 that is driven by circuitry in analog data acquisition system 116 that is described more completely in copending, commonly filed and commonly assigned U.S. patent application Ser. No. 08/293,973 entitled "Analog Data Acquisition System For Servo Position Bursts" of John P. Hill, that was referenced above. Output pin VREFL supplies the center voltage for the swing of analog voltages in analog data acquisition system 116.

Analog translation amplifier 380 shifts the ground reference level of the input analog signal on line CH_X_IN that is referenced to or centered about a ground level that is selected by positioning switch S1. When switch S1 is placed in position EXT, the analog signal on line CH_X_IN is DC level shifted so that the analog signal is centered around the voltage on pin VREFL and the resulting voltage is ouput on line CHANX. Conversely, when switch S1 is placed in position INT, the output analog signal on line CHANX is DC level shifted around the analog voltage supplied by a channel X level control circuit CH_X_LVL. Analog translation amplifier 380 is useful for interfacing ground referenced test equipment to single supply systems. In this embodiment, the output analog signal on line CHANX is connected to input pin CHX of integrated circuit 150. Input pin CHX provides an input signal to the analog data acquisition system 116 and so the output analog signal on line CHANX may be used to characterize the control systems.

The operation of both diagnostic data port 100 and diagnostic interface board 300 depends on the firmware used in integrated circuit 150 to load registers. Appendix A is a listing of firmware that can be used with diagnostic data port 100 and diagnostic interface board 300 to test and optimize a digital control tracking system. Appendix A is only an illustration of the use of the invention and is not intended to limit the invention to the particular applications provided by the software. Moreover, the particular language used is a function of the microcontroller, DSP, or microprocessor controlling the system on which diagnostic data port 100 is incorporated. For a particular microcontroller, DSP, or microprocessor, the instructions necessary to read data in one location and write that data to diagnostic data port 100, or to read data in diagnostic data port 100 will be apparent to those skilled in the art. In Appendix A, the language is for DSP 110 and is similar to assembly language for a microcontroller.

Figure 6:
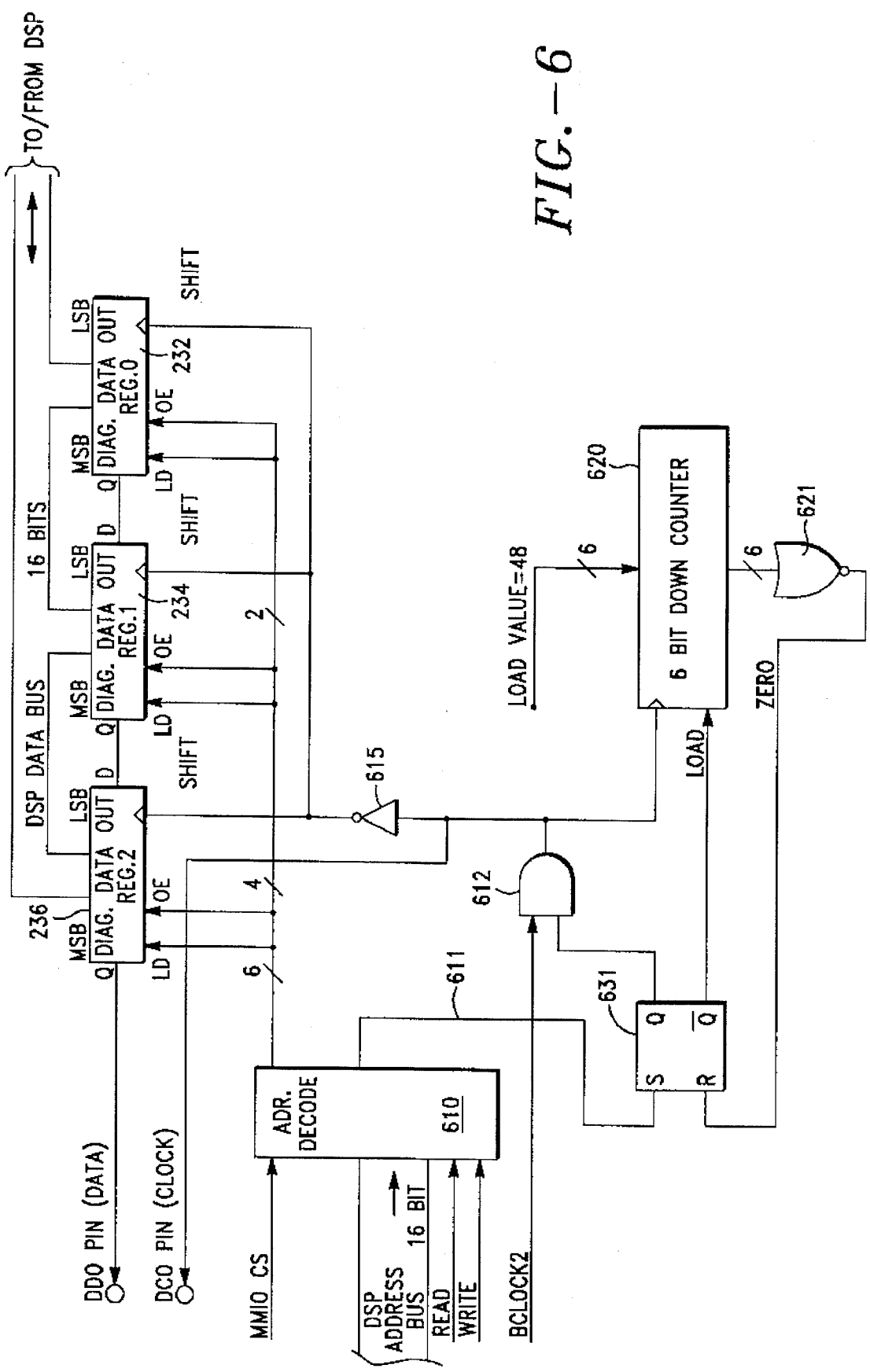
FIG. 6 is a more detailed diagram of the diagnostic data port of this invention.

FIG. 6 is a more detailed diagram of diagnostic data port 100 of this invention. Lines MMIO CS, READ, WRITE and 16-bit DSP address bus from the DSP memory controller drive an address decoder circuit 610. Address decoder circuit 610 is connected to load terminal LD and output enable terminal OE of each of registers 232, 234, and 236. Thus, in response to a write sequence of signals from the DSP memory controller, address decoder circuit 610 generates an active signal on each of load terminals LD so that 16-bits of data can be loaded into each of registers 232, 234, 236 from the DSP data bus.

Similarly, in response to a read sequence of signals from the DSP memory controller, address decoder circuit 610 generates an active signal on the output enable terminals OE so that data in the addressed register can be transferred to the DSP data bus. When the DSP writes to SR flip-flop 631, which in this embodiment is control register 231, address decoder circuit 610 generates an active signal on line 611 to terminal S of SR flip-flop 631. In response to the active signal on terminal S, SR flip-flop 631 generates an active signal on output terminal Q and an inactive signal on output terminal $\overline{Q}$.

The active signal from output terminal Q drives a first input terminal of AND gate 612. A second input terminal of AND gate 612 is driven by the clock signal on line BCLOCK2. Thus, in response to the active signal from output terminal Q, AND gate 612 passes the clock signal to terminal CLK of a 6-bit down counter 620 that was previously loaded with a value of 48.

The output signal from AND gate 612 also drives output pin DCO and an input terminal of inverter 615. The output signal of inverter 615 drives terminal SHIFT of each of registers 232, 234 and 236. Thus, on each rising edge of the clock signal on line BCLOCK2, counter 620 is decremented, and for each falling edge, a bit is shifted in registers 236, 234 and 232.

When the value of counter 620 is zero, the output signal of NOR gate 621 generates an active signal on terminal R of SR flip-flop 631. In response to the active signal on terminal R, SR flip-flop generates an active signal on output terminal $\overline{Q}$ and an inactive signal on output terminal Q. The active signal on output terminal $\overline{Q}$ reloads counter 620. The inactive signal on terminal Q causes AND gate 612 to mask the clock signal and so operation of diagnostic data port 100 is suspended until DSP 110 again writes to SR flip-flop 631.

In this embodiment, counter 620 is loaded with a value of 48 and so the information in all three registers 232, 234 and 236 is shifted out on pin DDO. However, in another embodiment, counter 620 is a programmable counter and can be loaded with a value of 16, 32, or 48. In this case, data can be shifted from one, two or three of the registers. No other modifications are required, because shift/latch control circuit 301 automatically latches the data, as described above.

The firmware listing in Appendix A is an example of one use of this invention that is intended to help test and optimize a digital control tracking system. A brief description of Appendix A follows.

In the initialization code, upon reset of integrated circuit 150, a pointer is initialized to the storage location of the digital data that is written to register 236 in diagnostic data port 100. Similarly, two pointers are initialized to the storage locations of analog data that are written to registers 234 and 232 in diagnostic data port 100. In addition, for each of the two analog signals, an analog gain and an analog offset are defined. The default values for the analog offset are zero and for the analog gains are 1.0. A gain variable of 0×0010 is defined as a gain of one. The scaling and multiply operations with that gain varaiable align the most significant bit of the register (D15) with the most significant bit of the D/A converter (D11). This scaling allows gain settings greater and less than 1.

In this embodiment, the digital data pointer addresses a state/status word that shows the present state of a tracking servo system. The pointer for the first analog channel addresses a tracking actuator position error and the pointer for the second analog channel addresses a tracking actuator velocity.

The three address pointers, the two analog gains, and the two offsets can be changed in one embodiment by commands from a computer in terminal mode that is connected to RS-232 port 111 of integrated circuit 150 via circuits 360 of diagnostic interface board 300. The use of a RS-232 port is illustrative only. The commands could be supplied over any port of the integrated circuit. In this embodiment, the commands are implemented within integrated circuit 150 by an extended set of monitor software that is loaded in memory of DSP 110.

Table 2 illustrates information about command OS. In Table 2, as well as in Tables 3 to 7, in the first row, the first column is the command; the second and third columns are parameters for the command; and the fourth column is a brief description of the function performed by the command. Following the first row is an example of using the command. The characters to the left of ">" and the ">" are a prompt to the user.

TABLE 2

| OS | xxxx | yyyy | send data over Diagnostic Outport |
|---|---|---|---|

Example:
O0FF2>OS

Command OS sends the data as specified by the commands OA, OG, OP, and OR, that are described more completely below, over diagnostic data port 100, i.e., in response to command OS, DSP 110 writes to control register 231. Parameters xxxx and yyyy are not used in command OS and no status is displayed.

TABLE 3

| OA | n | aaaa | address aaaa contains data to be used in diag outport register n |
|---|---|---|---|

Example:
O0FF2>OA 0 1234

Command OA sets a pointer to a memory location and when command OS or OD is initiated, the pointer is read to determine the memory location from which to get the data. Valid values of parameter n are zero, one and two. Parameter n is the diagnostic outport register identification, i.e., the identification for one of registers 232 to 236. Parameter aaaa is the address of the data. No status information is displayed.

TABLE 4

| OD | xxxx | yyyy | display diag outport selections (addr or register, offset, and gain) |
|---|---|---|---|

Examples:
A:) Data is retrieved from any memory location with the data memory address space:
O0FF2>OD

|  | Addr/Reg Ptr | Addr/Reg Data | Offset | Gain |
|---|---|---|---|---|
| DDO0 | 3000 | 45 | 10 | 2 |
| DDO1 | 3001 | 1234 | 0 | 10 |
| DDO2 | 3002 | AAAA | n/a | n/a |

B:) Data is retrieved from registers that are not in the data memory address space:
O0FF2>OD

|  | Addr/Reg Ptr | Addr/Reg Data | Offset | Gain |
|---|---|---|---|---|
| DDO0 | ext0 | 45 | 10 | 2 |
| DDO1 | ext3 | 1234 | 0 | 10 |
| DDO2 | ext4 | AAAA | n/a | n/a |

C:) Data is retrieved from any memory location with the data memory address space and from registers that are not in the data memory address space:
O0FF2>OD

|  | Addr/Reg Ptr | Addr/Reg Data | Offset | Gain |
|---|---|---|---|---|
| DDO0 | 4095 | 45 | 10 | 2 |
| DDO1 | ext3 | 1234 | 0 | 10 |
| DDO2 | 699A | AAAA | n/a | n/a |

Command OD displays the diagnostic data port settings as specified by commands OA, OG, OO, and OR. Parameters xxxx and yyyy are not used and on status is displayed. In the examples of Table 4, command OD is shown for retrieving data from within and outside the data memory address space. Following the command is the data send that is displayed on the monitor connected to board 300. The left most column in the display is a designation for each of the registers in diagnostic data port 100.

TABLE 5

| OG | n | vvvv | gain vvvv to multiply diagnostic outport register n data |
|---|---|---|---|

Example:
O0FF2>OG 0 10

Command OG allows the user to specify a gain that is applied to the analog data copied to one of analog diagnostic output registers 232 and 234. Parameter n is the analog diagnostic outport register for which the gain is applied. In this embodiment, valid values for parameter n are zero and one. Parameter vvvv is the value of the gain to be applied to the data. No status is displayed.

TABLE 6

| OO | n | vvvv | offset vvvv to add to diagnostic outport register n data |
|----|---|------|---------------------------------------------------------|

Example:
OOFF2>OO 0 50

Command OO allows the user to specify an offset that is applied to the analog data copied to one of analog diagnostic output registers 232 and 234. Parameter n is the analog diagnostic outport register for which the offset is applied. In this embodiment, valid values for parameter n are zero and one. Parameter vvvv is the value of the offset to be applied to the data. No status is displayed.

TABLE 7

| OR | n | m | external reg m data to be used in diagnostic outport register n |
|----|---|---|------------------------------------------------------------------|

Example:
OOFF2>OR 0 4

Command OR is used to specify that the data copied to a diagnostic data outport register 232, 234, and 236 is retrieved from an external register, i.e., a register that is not in the data memory address space. Parameter n is the diagnostic data output register into which the data is copied, and valid values are zero through two. Parameter m is the external register from whence the data is copied and valid values are zero through five. No status is displayed.

Hence, in this embodiment, the above serial port commands are implemented to allow the user to change the value of any one or all of the three address pointers, the two analog gains, and the two offsets.

The servo burst interrupt code module in Appendix A is called at each servo bust interrupt after the time-critical functions have been processed. All diagnostic data output registers 232, 234 and 236 are updated, and therefore diagnostic interface board 300 outputs data at the sample rate of the servo system, i.e., real time sampled data is obtained from diagnostic data port 100 for internal functions of integrated circuit 150.

In this example, the digital channel address pointer is read to determine the memory location from which the data is copied to register 236. The analog channel 1 address pointer is then read and that data at that memory location is accessed. The analog channel 1 offset value is then read and added to the data retrieved from the specified memory location. The result is multiplied by the analog channel 1 gain with the appropriate scaling shifts. (0×0010=1X) Analog diagnostic data output register 234 is then loaded with the result. The data for analog channel 2 is then processed in a similar manner to the data for analog channel 1 and the result written to analog diagnostic data output register 232. Finally, DSP 110 writes to diagnostic control register 231 with any value to start the hardware controlled data output sequence from diagnostic data port 100.

The output signal of translation amplifier 380 on diagnostic interface board 300 to the channel X input pin of integrated circuit 150 can be used to input a disturbance from a dynamic signal analyzer (DSA). Integrated circuit 150 could be programmed to add the signal from channel X input pin to an internal control loop error signal. The internal control loop error signal before and after the addition can be sent to diagnostic data port 100 and consequently to the DSA, which in turn allows a transfer function of the loop to be measured.

Outputting signals that represent "physical" variables such as "Tracking Position Error" or "Spin Period Error" through the analog channels of diagnostic data port 100 provides a means for a spectrum analyzer to analyze system dynamics. To analyze small perturbations of variables that have large average values, the average value can be subtracted out using the analog channel offset variable and then the perturbation can be magnified using the analog gain variable.

Other applications of diagnostic data port 100 include outputting an analog type variable and displaying the analog type variable on digital display 348 to verify shifting operations or alignment. A digital type variable can be output and displayed as an analog waveform to display sequences of states on an oscilloscope. Alternatively, two digital type variable can be output on the analog channels and displayed on a scope in an X/Y mode to generate a state space type display.

The embodiment of the diagnostic data port and the diagnostic board described above are only illustrative of the principles of this invention are not intended to limit the invention to the particular embodiment disclosed. In view of this disclosure, those skilled in the art can implement the two-wire dedicated diagnostic data port in a wide variety of integrated circuits and in a wide variety of configurations to achieve the advantages described above.

APPENDIX A

Unpublished © 1994, Adaptec, Inc.

```
;============== START OF FILE DESCRIPTION==============
;    FILE NAME:     DDO.ASM
;    DESCRIPTION:   DIAGNOSTIC DATA OUTPORT MODULE
;
;
;------------------------------------------------------
;    GENERAL DEFINITIONS AND MACROS:
;------------------------------------------------------
.INCLUDE "system.inc"
.INCLUDE "nyquist.inc"      ; Nyquist MMIO definitions
(DIAGDO needed)
.INCLUDE "ascii.inc"        ; ASCII definitions
.INCLUDE "error.inc"        ; Error code definitions
;------------------------------------------------------
;    EXTERNAL DECLARATIONS:
;------------------------------------------------------
.EQU GLOBAL    EXTERN       ; Declare GLOBALS as
EXTERN
.INCLUDE "mon.inc"; need to use the external register
read routine
.INCLUDE "ser.inc"; serial port write routine (TxCMsg)
.INCLUDE "srv.inc";
.PURGE   GLOBAL
;------------------------------------------------------
;    PUBLIC DECLARATIONS:
;------------------------------------------------------
.EQU GLOBAL PUBLIC; Declare GLOBALS as PUBLIC
.INCLUDE "ddo.inc"
.PURGE   GLOBAL
;------------------------------------------------------
;============== END OF FILE DESCRIPTION ==============

;------------------------------------------------------
```

```
;    EQUATES:
;------------------------------------------------
.EQU UNITY_GAIN 0x0010; Unity gain for Diag Data Out
Port
;
; the following two equates are used in Oflagx
;
.EQU ADDRPTR 0x0000; value in Ovalnn is an address
pointer
.EQU REGPTR 0x0001; value in Ovalnn is an external
register ptr
;------------------------------------------------
;    DATA DEFINITIONS:
;------------------------------------------------
.DATA      ddoC
;
;        Addr/Reg   Addr/Reg
;         ptr        data       Offset    Gain
;DIAGD0   xxxx       xxxx       xxxx      xxxx
;DIAGD1   xxxx       xxxx       xxxx      xxxx
;DIAGD2   xxxx       xxxx       n/a       n/a
;
DispStr0:
DW  CR PA LF                              ;\n
    DW  SP PA SP, SP PA SP, SP PA SP, SP PA SP, _A PA
_d   ;           Ad|
    DW   _d PA _r, FS PA _R, _e PA _g, SP PA SP, SP PA
_A   ;dr/Reg     A|
    DW   _d PA _d, _r PA FS, _R PA _e, _g PA SP, CR PA
LF   ;ddr/Reg \n|
    DW  NU                                ;\0
DispStr1:
    DW   SP PA SP, SP PA SP, SP PA SP, SP PA SP, _P PA
_t   ;           Pt|
    DW   _r PA SP, SP PA SP, SP PA SP, SP PA SP, SP PA
_D   ;r          D|
```

```
        DW    _a PA _t, _a PA SP, SP PA SP, SP PA SP, SP PA
_O     ;ata      o|
        DW    _f PA _f, _s PA _e, _t PA SP, SP PA _G, _a PA
_i     ;ffset Gai|
        DW    _n PA SP, CR PA LF                              ;n \n|
        DW    NU
DispStr2A:
        DW    _D PA _I, _A PA _G, _D PA _O, SP PA SP, PT PA
_X     ;DIAGDO     xx|
        DW    SP PA SP, SP PA SP, SP PA SP, SP PA PT, _X PA
SP     ;xx         x|
        DW    SP PA SP, SP PA SP, SP PA PT, _X PA SP, SP PA
SP     ;xxx        x|
        DW    SP PA PT, _X PA CR, LF
;xxx     xxxx\n|
        DW    NU                                              ;\0
DispStr2R1:
        DW    _D PA _I, _A PA _G, _D PA _O, SP PA SP
  ;DIAGDO    |
        DW    _e PA _x, _t                                    ;ext|
        DW    NU
ExtRegTbl:
        DW    _0
        DW    NU
        DW    _1
        DW    NU
        DW    _2
        DW    NU
        DW    _3
        DW    NU
        DW    _4
        DW    NU
        DW    _5
        DW    NU
DispStrR2:
        DW    SP PA SP, SP PA SP, SP PA SP, SP PA PT, _X PA
```

```
SP       ;      xxxx  |
    DW    SP PA SP, SP PA SP, SP PA PT, _X PA SP, SP PA
SP       ;      xxxx  |
    DW    SP PA PT, _X PA CR, LF                          ;
xxxx\n|
    DW    NU                                        ;\0

DispStr3A:
    DW    _D PA _I, _A PA _G, _D PA _1, SP PA SP, PT PA
_X       ;DIAGD1 %X|
    DW    SP PA SP, SP PA SP, SP PA SP, SP PA PT, _X PA
SP       ;xx     x|
    DW    SP PA SP, SP PA SP, SP PA PT, _X PA SP, SP PA
SP       ;xxx    x|
    DW    SP PA PT, _X PA CR, LF
;xxx     xxxx\n|
    DW    NU                                        ;\0
DispStr3R1:
    DW    _D PA _I, _A PA _G, _D PA _1, SP PA SP
  ;DIAGD1   |
    DW    _e PA _x, _t                              ;ext|
    DW    NU DispStr4A:
    DW    _D PA _I, _A PA _G, _D PA _2, SP PA SP, PT PA
_X       ;DIAGD2 xx|
    DW    SP PA SP, SP PA SP, SP PA SP, SP PA PT, _X PA
SP       ;xx     x|
    DW    SP PA SP, SP PA SP, SP PA _n, FS PA _a, SP PA
SP       ;xxx    n|
    DW    SP PA SP, SP PA _n, FS PA _a, CR PA LF
  ;/a     n/a \n
    DW    NU                                        ;\0
DispStr4R1:
    DW    _D PA _I, _A PA _G, _D PA _2, SP PA SP
  ;DIAGD2   |
```

```
        DW      _e PA _x, _t                            ;ext|
        DW      NU
DispStr4R2:
        DW      SP PA SP, SP PA SP, SP PA SP, SP PA PT, _X PA
SP      ;xx           x|
        DW      SP PA SP, SP PA SP, SP PA _n, FS PA _a, SP PA
SP      ;xxx          n|
        DW      SP PA SP, SP PA _n, FS PA _a, CR PA LF
   ;/a      n/a  \n
        DW      NU                                      ;\0

.DATA       ddoD
Oflag0: DW  1           DUP ?           ; used to indicate
if Ovalxx has an
Oflag1: DW  1           DUP ?           ; address or an
external register
Oflag2: DW  1           DUP ?           ; number to be used.
Oval00: DW  1           DUP ?
Oval01: DW  1           DUP ?
Oval02: DW  1           DUP ?
Ooff00: DW  1           DUP ?
Ooff01: DW  1           DUP ?
Ogain0: DW  1           DUP ?
Ogain1: DW  1           DUP ?

.DATA ddoI

DW  1           DUP ddoD.Oflag0
        DW  1           DUP 0x0000
        DW  1           DUP ddoD.Oflag1
        DW  1           DUP 0x0000
        DW  1           DUP ddoD.Oflag2
        DW  1           DUP 0x0000
        DW  1           DUP ddoD.Oval00
        DW  1           DUP srvD.pes
```

```
        DW    1          DUP  ddoD.Oval01
        DW    1          DUP  srvD.vel_est
        DW    1          DUP  ddoD.Oval02
        DW    1          DUP  srvD.trkflag
        DW    1          DUP  ddoD.Ooff00
        DW    1          DUP  0x0000
        DW    1          DUP  ddoD.Ooff01
        DW    1          DUP  0x0000
        DW    1          DUP  ddoD.Ogain0
        DW    1          DUP  0x0010
        DW    1          DUP  ddoD.Ogain1
        DW    1          DUP  0x0100

.CODE     ddoP
.USE      ddoD

;================ START OF PROLOGUE ==================
;     PROCEDURE NAME: OutportAddress
;     DESCRIPTION:    Select DDOP Address Procedure
;
;     SPECIFICATION:
;
;     PARAMETERS IN:   r0 - points to the command
in the command buffer
;     DATA IN:
;     REGISTER USAGE:
;     DATA ALTERED:
;
;================ END OF PROLOGUE ==================
;
OutportAddress:
      mov  (r0), a11      ; to be used to set flag bit
      mov  (r0)+, a01            ; a0 has register #,
point Data2
      cmp  #2, a0
```

```
        brr   >%OKid, le           ; br, valid DDOP id #
Badid:
        mov   #S_INVCMD, a01       ; invalid command
status
        ret
%OKid:
        add   ##Oflag0, a1         ; add offset to point to
flag bits
        mov   a11, r2
        mov   ##ADDRPTR, a1        ; indicate that this is
an address ptr
        mov   a11, (r2)

add   ##Oval00, a0
SetOutParm:
        mov   a01, r2              ; address of selected
DDOP add reg
        mov   (r0)+, a0            ; Read Data2; point
Status
        mov   a01, (r2)            ; store new DDOP
select address
        clr   a0
        ret ;=============== START OF PROLOGUE ================
;     PROCEDURE NAME: OutportOffset
;     DESCRIPTION:    Set Outport Offset Procedure
;
;     SPECIFICATION:
;
;     PARAMETERS IN:    r0 - points to the command
in the command buffer
;     DATA IN:
;     REGISTER USAGE:
;     DATA ALTERED:
;
```

```
;================ END OF PROLOGUE ====================
;
OutportOffset:
      mov   (r0)+, a01              ; a0 has register #,
point Data2
      cmp   #1, a0
      brr   ddoP.Badid, gt          ; br, invalid DDOP
id #
      add   ##Ooff00, a0
      brr   ddoP.SetOutParm ;================ START OF PROLOGUE ==================
;    PROCEDURE NAME: OutportGain
;    DESCRIPTION:    Set Outport Gain Procedure
;
;    SPECIFICATION:
;
;    PARAMETERS IN:     r0 - points to the command
in the command buffer
;    DATA IN:
;    REGISTER USAGE:
;    DATA ALTERED:
;
;================ END OF PROLOGUE ====================
;
OutportGain:
      mov   (r0)+, a01              ; a0 has register #,
point Data2
      cmp   #1, a0
      brr   ddoP.Badid, gt          ; br, invalid DDOP id #
      add   ##Ogain0, a0
      brr   ddoP.SetOutParm ;================ START OF PROLOGUE ==================
;    PROCEDURE NAME: OutputDDOP
;    DESCRIPTION:    Output DDOP Procedure
```

```
;
;     SPECIFICATION:
;
;     DATA IN:           DDOP00, DDOP01, DDOP02
;     REGISTER USAGE:    a0, r0, r2, r4
;     DATA ALTERED:      DIAGD0, DIAGD1, DIAGD2, DIAGDC
;
;=============== END OF PROLOGUE ==================
;
OutputDDOP:
     PUSH   st1                      ; save shift mode
     mov    ##~SHIFTP, a0
     and    st1, a0
     mov    a01, st1                 ; p-shift off mov    ##DIAGD0, r2             ; point to DIAGD0
register
     mov    @Oval00, r0              ; point to address
for DIAGD0
     mov    (r0), a0                 ; Get value (analog)
     mov    @Oflag0, a1              ; check flag bit
     cmp    ##REGPTR, a1
     brr    >%NotExt0, neq           ; br if flag not set
     mov    @Oval00, a0              ; put reg value in a0
     shl    a0
     add    ##monP.Readext, a0
     calla  a01
%NotExt0:
     add    @Ooff00, a0              ; Add offset
     mov    @Ogain0, y
     mpy    y, a01                   ; apply gain
     mov    p, a0
     shr4   a0                       ; scale
     mov    a01, (r2)+               ; Store Value DIAG0;
point DIAGD1
```

```
    mov    @Oval01, r0           ; point to address for DIAGD1
    mov    (r0), a0              ; Get value (analog)
    mov    @Oflag1, a1           ; check flag bit
    cmp    ##REGPTR, a1
    brr    >%NotExt1, neq        ; br if flag not set
    mov    @Oval01, a0           ; put value in a0
    shl    a0
    add    ##monP.Readext, a0
    calla      a01
%NotExt1:
    add    @Ooff01, a0           ; Add offset
    mov    @Ogain1, y
    mpy    y, a01                ; apply gain
    mov    p, a0
    shr4   a0                    ; scale
    mov    a01, (r2)+            ; Store Value DIAG1; point DIAGD2 mov    @Oval02, r0           ; point to address for DIAGD2
    mov    (r0), a0              ; Store value at DIAGD2 (digital)
    mov    @Oflag2, a1           ; address for flag bit
    cmp    ##REGPTR, a1
    brr    >%NotExt2, neq        ; br if flag not set
    mov    @Oval02, a0           ; put reg value in a0
    shl    a0
    add    ##monP.Readext, a0
    calla      a01
%NotExt2:
    mov    a01, (r2)+            ; point to DIAGDC register mov    a01, (r2)             ; Send the Diagnostic data out
```

```
        POP   stl                         ; restore p-shift
mode
        ret ;================= START OF PROLOGUE =================
;    PROCEDURE NAME: OutportDisplay
;    DESCRIPTION:    Display Selected DDOP Output
;
;    SPECIFICATION:
;
;    PARAMETERS IN:     r0 - points to the command
in the command buffer
;    DATA IN:
;    REGISTER USAGE:
;    DATA ALTERED:
;
;================== END OF PROLOGUE ==================

OutportDisplay:
        mov  ##ddoC.DispStr0, r0         ; first header line
        call serP.TxCMsg                 ; print it out to
the terminal
        call serP.LinePrintWait          ; wait until done
        mov  ##ddoC.DispStr1, r0         ; second header line
        call serP.TxCMsg                 ; print it out to
the terminal
        call serP.LinePrintWait          ; wait until done
;
; get data for output of DIAGD0 line, push on stack in
reverse order of
; printing, then load up the text in r0 and call the
transmit routine
;
        mov  @Ogain0, r2                 ; gain0
        PUSH r2                          ; push gain 0 value
        mov  @Ooff00, r2                 ; offset 0
```

```
    PUSH r2                      ; push offset 0 value
;
; check to see if the addr/reg ptr is an external address
;
    mov   @Oval00, r2            ; value addr or reg?
    mov   @Oflag0, a0            ; check flag bit
    cmp   ##REGPTR, a0           ; see if reg or addr ptr
    br    >%ExtReg0, eq          ; br if it's a register mov   (r2), r4
    PUSH  r4                     ; data
    PUSH  r2                     ; pointer (addr)
    mov   ##ddoC.DispStr2A, r0   ; display text
    call  serP.TxCMsg
    call  serP.LinePrintWait
;
; adjust stack to top again
;
    mov   #4, a0h                ; there were four words
    addh  sp, a0                 ; added on the stack
    mov   a0h, sp                ; so adjust those out!
    br    >%DisplayDDO1
;
; register stuff instead - offset and gain already on the stack!
;
%ExtReg0:
    mov   ##ddoC.DispStr2R1, r0  ; print out the DIAGDO string
    call  serP.TxCMsg
    call  serP.LinePrintWait
```

;
; which register?
;
```
    mov   @Oval00, a0              ; get register number
    shl   a0
    add   ##monP.Readext, a0
    calla a01                      ; read the contents of the reg
    PUSH  a01                      ; put data on stack!
    mov   @Oval00, a0
    shl   a0
    add   ##ddoC.ExtRegTbl, a0     ; get correct output!
    mov   a01, r0
    call  serP.TxCMsg              ; print register #
    call  serP.LinePrintWait
    mov   ##ddoC.DispStrR2, r0
    call  serP.TxCMsg              ; print data, offset, gain!
    call  serP.LinePrintWait
```
;
; adjust stack....three items left on the stack from the printing
;
```
    mov   #3, a0h                  ; there were three words
    addh  sp, a0                   ; added on the stack
    mov   a0h, sp                  ; so adjust those out!
```
;
; Do all this again for DIAGD1 too
;
%DisplayDD01:
```
    mov   @Ogain1, r2              ; gain 1
    PUSH  r2                       ; push gain 1 value
```

```
    mov   @Ooff01, r2              ; address of offset 1
    PUSH  r2                       ; push offset 1 value
;
; check to see if the addr/reg ptr is an external address
;
    mov   @Oval01, r2              ; value addr or reg?
    mov   @Oflag1, a0              ; get flag setting
    cmp   ##REGPTR, a0             ; see if reg or addr ptr
    br    >%ExtReg1, eq            ; br if it's a register mov   (r2), r4
    PUSH  r4                       ; data
    PUSH  r2                       ; pointer (addr)
    mov   ##ddoC.DispStr3A, r0     ; display text
    call  serP.TxCMsg
    call  serP.LinePrintWait
;
;   adjust stack to top again
;
    mov   #4, a0h                  ; there were four words
    addh  sp, a0                   ; added on the stack
    mov   a0h, sp                  ; so adjust those out!
    br    >%DisplayDDO2
;
; register stuff instead - offset and gain already on the stack!
;
%ExtReg1:
    mov   ##ddoC.DispStr3R1, r0    ; print out the DIAGD1 string
```

```
        call serP.TxCMsg
        call serP.LinePrintWait
;
; which register?
;
        mov   @Oval01, a0
        shl   a0
        add   ##monP.Readext, a0
        calla      a01                  ; read the contents
of the reg
        PUSH a01                        ; put data on stack!
        mov   @Oval01, a0
        shl   a0
        add   ##ddoC.ExtRegTbl, a0      ; get correct
output!
        mov   a01, r0
        call serP.TxCMsg                ; print register #
        call serP.LinePrintWait
        mov   ##ddoC.DispStrR2, r0
        call serP.TxCMsg                ; print data,
offset, gain!
        call serP.LinePrintWait
;
; adjust stack....three items left on the stack from
the printing
;
        mov   #3, a0h                   ; there were three
words
        addh  sp, a0                    ; added on the stack
        mov   a0h, sp                   ; so adjust those
out!
;
; Do all this again for DIAGD2 too
;
%DisplayDD02:
;
```

```
; check to see if the addr/reg ptr is an external
address
;
      mov   @Oval02, r2              ; value addr or reg?
      mov   @Oflag2, a0              ; flag bit in a0
      cmp   ##REGPTR, a0             ; see if reg or addr ptr
      br    >%ExtReg2, eq            ; br if it's a register mov   (r2), r4
      PUSH  r4                       ; data
      PUSH  r2                       ; pointer (addr)
      mov   ##ddoC.DispStr4A, r0     ; display text
      call  serP.TxCMsg
      call  serP.LinePrintWait
;
;  adjust stack to top again
;
      mov   #2, a0h                  ; there were two words
      addh  sp, a0                   ; added on the stack
      mov   a0h, sp                  ; so adjust those out!
      br    >%DisplayDone
;
; register stuff instead - offset and gain already on
the stack!
;
%ExtReg2:
      mov   ##ddoC.DispStr4R1, r0    ; print out the DIAGD2 string
      call  serP.TxCMsg
      call  serP.LinePrintWait
;
; which register?
```

```
        mov    @Oval02, a0
        shl    a0
        add    ##monP.Readext, a0
        calla      a01                  ; read the contents
of the reg
        PUSH a01                        ; put data on stack!
        mov    @Oval02, a0
        shl    a0
        add    ##ddoC.ExtRegTbl, a0     ; get correct
output!
        mov    a01, r0
        call serP.TxCMsg                ; print register #
        call serP.LinePrintWait
        mov    ##ddoC.DispStr4R2, r0
        call serP.TxCMsg                ; print data--no
offset or gain
        call serP.LinePrintWait
;
; adjust stack....one item left on the stack from the
printing
;
        mov    #1, a0h                  ; there were three
words
        addh sp, a0                     ; added on the stack
        mov    a0h, sp                  ; so adjust those
out!
;
; Done!
;
%DisplayDone:
        mov    #S_OK, a01
        ret ;================ START OF PROLOGUE ================
;    PROCEDURE NAME: OutportSend
```

```
;       DESCRIPTION:      Send Selected DDOP Output
;
;       SPECIFICATION:
;
;       PARAMETERS IN:    r0 - points to the command
in the command buffer
;       DATA IN:
;       REGISTER USAGE:
;       DATA ALTERED:
;
;================ END OF PROLOGUE ==================

OutportSend:
        call ddoP.OutputDDOP        ; just do it!

mov  #S_OK, a01             ; return success
        ret

;================ START OF PROLOGUE ================
;       PROCEDURE NAME: OutportRegister
;       DESCRIPTION:      Selected DDOP External Register
;
;       SPECIFICATION:
;
;       PARAMETERS IN:    r0 - points to the command
in the command buffer
;       DATA IN:
;       REGISTER USAGE:
;       DATA ALTERED:
;
;================ END OF PROLOGUE ==================

OutportRegister:
        mov  (r0)+, a01             ; get DDOP id
        cmp  #2, a0                 ; must be between 0 and 2,
``` inclusive
```
      br    ddoP.Badid, gt
      mov   a01, r1          ; save DDOP id for a second
use
      mov   (r0), a1         ; check the external register input
      cmp   #5, a1           ; must be between 0 and 5,
inclusive
      br    ddoP.Badid, gt
;
; update flag to indicate the value in Ovalxx is an
external register pointer
;
      add   ##Oflag0, a0
      mov   a01, r2
      mov   ##REGPTR, a0     ; data to write to flag bit
      mov   a01, (r2)
;
; update the value with the external register id
;
      mov   r1, a01          ; restore DDOP id
      add   ##Oval00, a0     ; point to correct value
storage
      br    ddoP.SetOutParm
```

I claim:

1. In an integrated circuit, a diagnostic data port comprising:
   a serially connected memory; and
   an unidirectional two-pin integrated circuit output port connected to said serially connected memory where a first output pin in said two-pin integrated circuit output port is a data output pin and a second output pin in said two-pin integrated circuit output port is a clock output pin.

2. In an integrated circuit, a diagnostic data port as in claim 1 wherein said serially connected memory comprises a plurality of serially connected registers.

3. In an integrated circuit, a diagnostic data port as in claim 2 wherein said plurality of serially connected registers comprises three serially connected sixteen bit registers.

4. In an integrated circuit, a diagnostic data port as in claim 1 further comprising:
   a processor data bus; and
   a processor address bus wherein said serially connected memory is connected to said processor data bus and said processor address bus so that a processor can load data into said serially connected memory.

5. In an integrated circuit, a diagnostic data port as in claim 1 further comprising a clock input line wherein said clock input line is coupled to said clock output pin in said two-pin integrated circuit output port.

6. In an integrated circuit, a diagnostic data port as in claim 5 wherein said serially connected memory comprises a shift terminal and further wherein said clock input line is coupled to said shift terminal.

7. In an integrated circuit, a diagnostic data port as in claim 4 further comprising:
   an address decoder circuit coupled to:
      said processor data bus;
      said processor address bus; and said serially connected memory wherein,
         upon receiving a write sequence of signals from said processor, said address decoder circuit loads data from said processor data bus into said serially connected memory, and
         upon receiving a read sequence of signals from said processor, said address decoder circuit transfers data from said serially connected memory to said processor data bus.

8. In an integrated circuit, a diagnostic data port as in claim 7, wherein said serially connected memory comprises a plurality of serially connected registers.

9. In an integrated circuit, a diagnostic data port as in claim 8, wherein said address decoder circuit further comprises:
   a memory mapped I/O chip select (MMIO CS) input terminal;
   a read input terminal coupled to a read input line from said processor;
   a write input terminal coupled to a write input line from said processor; and
   an output terminal coupled to a load terminal and an output enable terminal of said serially connected registers.

10. In an integrated circuit, a diagnostic data port as in claim 7 further comprising:
    a control register circuit including:
       a first control register input terminal coupled to a second output terminal of said address decoder circuit;
       a second control register input terminal;
       a first control register output terminal; and
       a second control register output terminal;
    a clock input line;
    a first logic gate having:
       a first input terminal coupled to said first control register circuit output terminal;
       a second input terminal coupled to said clock input line; and
       an output terminal coupled to said clock output pin;
    a counter circuit having:
       a first counter input terminal coupled to said second control register output terminal;
       a second counter input terminal coupled to said output terminal of said first logic gate; and
       a plurality of counter circuit output terminals;
    a second logic gate having:
       a plurality of input lines wherein each input line is connected to a different one of said plurality of counter circuit output terminals; and
       an output terminal coupled to said second control register input terminal; and
    an inverter having:
       an input terminal coupled to said output terminal of said first logic gate; and
       an output terminal coupled to a clock terminal of each of said serially connected memory.

11. In an integrated circuit, a diagnostic data port as in claim 10, wherein said counter circuit is a programmable down counter circuit.

12. In an integrated circuit, a diagnostic data port as in claim 11, wherein said programmable down counter circuit can be loaded with one of the values from the group consisting of 16, 32, or 48.

13. In an integrated circuit, a diagnostic data port as in claim 10, wherein said first logic gate is an AND gate.

14. In an integrated circuit, a diagnostic data port as in claim 10, wherein said second logic gate is a NOR gate.

15. In an integrated circuit, a diagnostic data port comprising:
    a plurality of serially connected registers;
    an unidirectional two-pin integrated circuit output port connected to said serially connected registers wherein a first output pin in said two-pin integrated circuit output port is a data output pin, and a second output pin in said two-pin integrated circuit output port is a clock output pin;
    a processor data bus;
    a processor address bus wherein said serially connected registers are connected to said processor data bus and said processor address bus so that a processor can load data into said serially connected registers;
    an address decoder circuit, said address decoder circuit including:
       a memory mapped I/O chip select (MMIO CS) input terminal;
       a read input terminal coupled to a read input line from said processor;
       a write input terminal coupled to a write input line from said processor; and
       an output terminal coupled to a load terminal and an output enable terminal of at least one of said serially connected registers; a control register circuit including:
          a first control register input terminal coupled to a second output terminal of said address decoder circuit;

a second control register input terminal;
a first control register output terminal; and
a second control register output terminal;
a clock input line;
a first logic gate having:
- a first input terminal coupled to said first control register output terminal;
- a second input terminal coupled to said clock input line; and
- an output terminal coupled to said clock output pin;

a counter circuit having:
- a first counter input terminal coupled to said second control register output terminal;
- a second counter input terminal coupled, to said output terminal of said first logic gate; and
- a plurality of counter circuit output terminals;

a second logic gate having:
- a plurality of input lines wherein each input line is connected to a different one of said plurality of counter circuit output terminals; and
- an output terminal coupled to said second control register input terminal; and an inverter having:
- an input terminal coupled to said output terminal of said first logic gate; and
- an output terminal coupled to a clock terminal of each of said serially connected registers.

* * * * *